(12) United States Patent
Kim et al.

(10) Patent No.: US 10,270,004 B2
(45) Date of Patent: Apr. 23, 2019

(54) PRODUCTION METHOD FOR TRANSPARENT ELECTRICALLY-CONDUCTIVE FILM USING MULTISTAGE LIGHT IRRADIATION

(71) Applicant: N&B CO., LTD., Gongju-si, Chungcheongnam-do (KR)

(72) Inventors: Hak-Sung Kim, Seoul (KR); Wan Ho Chung, Paju-si (KR); Dong Hyun Kim, Seoul (KR)

(73) Assignee: N&B CO., LTD., Gongju-si (KR)

( * ) Notice: Subject to any disclaimer, the term of this patent is extended or adjusted under 35 U.S.C. 154(b) by 113 days.

(21) Appl. No.: 15/108,448

(22) PCT Filed: Aug. 11, 2015

(86) PCT No.: PCT/KR2015/008400
§ 371 (c)(1),
(2) Date: Jun. 27, 2016

(87) PCT Pub. No.: WO2016/024793
PCT Pub. Date: Feb. 18, 2016

(65) Prior Publication Data
US 2016/0322133 A1    Nov. 3, 2016

(30) Foreign Application Priority Data

Aug. 11, 2014 (KR) .......... 10-2014-0103637
May 21, 2015 (KR) .......... 10-2015-0071293

(51) Int. Cl.
| | | |
|---|---|---|
| B05D 3/00 | (2006.01) | |
| C08J 7/18 | (2006.01) | |
| G21H 5/00 | (2006.01) | |
| H01L 31/18 | (2006.01) | |
| G06F 3/041 | (2006.01) | |

(52) U.S. Cl.
CPC .......... H01L 31/1884 (2013.01); G06F 3/041 (2013.01)

(58) Field of Classification Search
CPC .......... H01L 31/1884; H01L 21/02697; H01L 21/02664; G06F 3/041
See application file for complete search history.

(56) References Cited

U.S. PATENT DOCUMENTS

| | | | |
|---|---|---|---|
| 7,714,351 B2 | 5/2010 | Moon et al. | |
| 8,809,901 B2 | 8/2014 | Moon et al. | |
| 2010/0078624 A1 | 4/2010 | Moon et al. | |
| 2010/0187498 A1 | 7/2010 | Moon et al. | |
| 2011/0192633 A1* | 8/2011 | Allemand ............ | C09D 11/101 174/128.1 |
| 2012/0329209 A1* | 12/2012 | Song ................ | H01L 21/02521 438/104 |
| 2013/0033840 A1* | 2/2013 | Welling ........... | G06K 19/07345 361/783 |
| 2013/0266795 A1* | 10/2013 | Schultz ................ | C09D 5/24 428/323 |
| 2014/0345921 A1 | 11/2014 | Moon et al. | |
| 2015/0056382 A1* | 2/2015 | Suganuma ........... | H01B 1/22 427/553 |

FOREIGN PATENT DOCUMENTS

| | | | |
|---|---|---|---|
| JP | 2009-277640 | 11/2009 | |
| JP | 2014-038749 | 2/2014 | |
| KR | 10-2007-0024006 | 3/2007 | |
| KR | 10-2008-0101957 | 11/2008 | |
| KR | 10-2012-0092294 | 8/2012 | |
| KR | 10-1263194 | 5/2013 | |
| KR | 10-2013-0072064 | 7/2013 | |
| KR | 10-2014-0040919 | 4/2014 | |
| WO | WO-2013161996 A2 * | 10/2013 | .............. H01B 1/22 |

OTHER PUBLICATIONS

International Search Report for corresponding International PCT Application No. PCT/KR2015/008400.

* cited by examiner

Primary Examiner — Michael P Wieczorek
(74) Attorney, Agent, or Firm — Hauptman Ham, LLP

(57) ABSTRACT

Provided is a production method for a transparent electrically-conductive film including: a) a coating step of coating an electrically-conductive nanowire dispersion containing electrically-conductive nanowires with an optical activity and an organic binder onto a substrate; b) a first light irradiation step of irradiating a first light including a first ultraviolet (UV) light onto the coated electrically-conductive nanowires; and c) a second light irradiation step of irradiating a second light including a pulse-type first white light onto the electrically-conductive nanowires.

24 Claims, 6 Drawing Sheets

[FIG. 1]
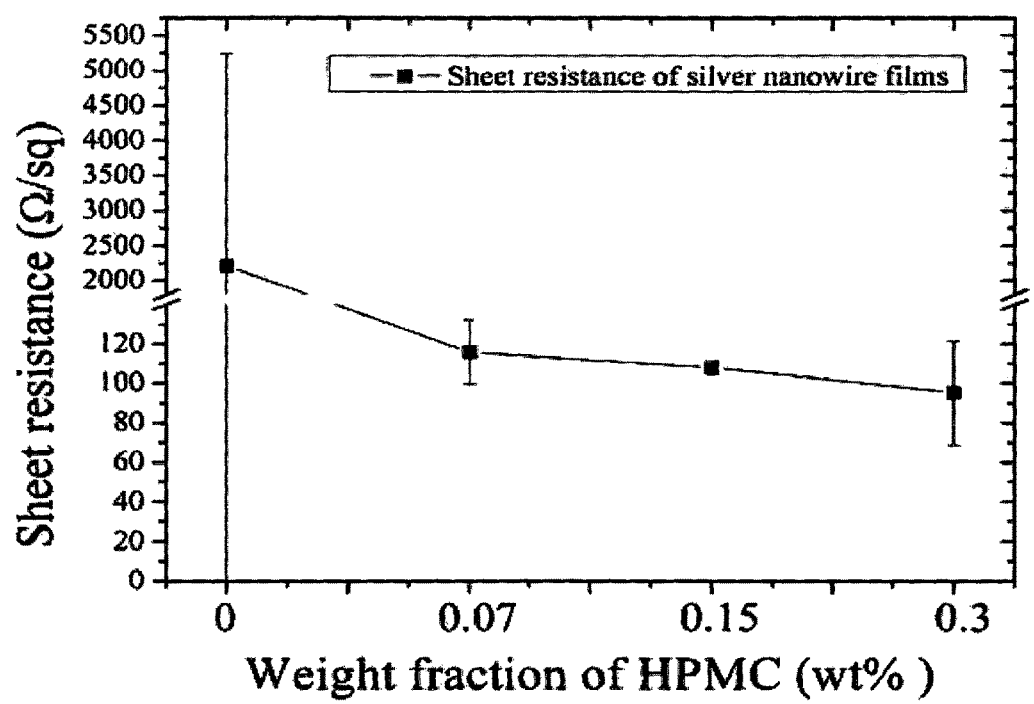

[FIG. 2]
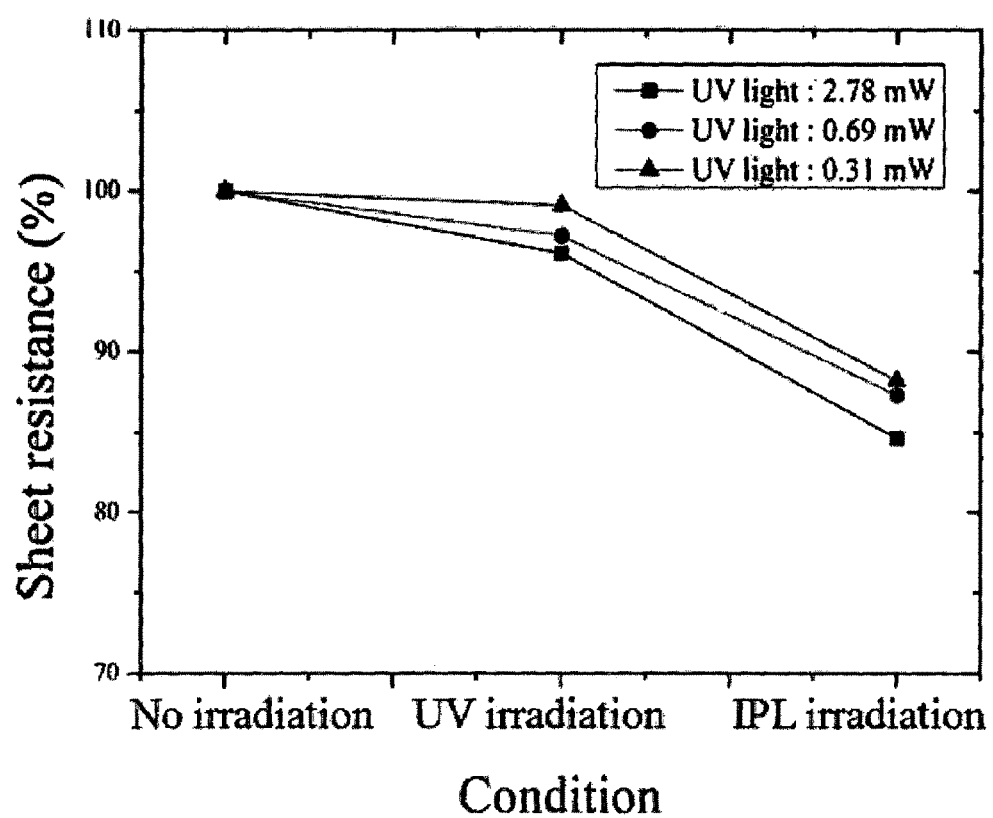

[FIG. 3]
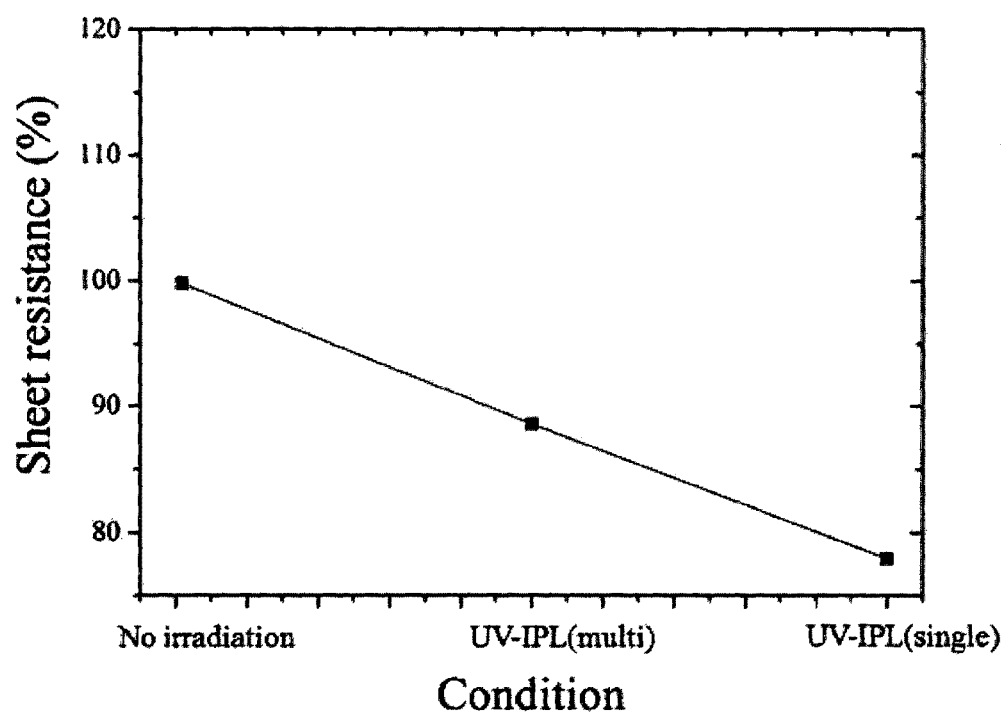

[FIG. 4]
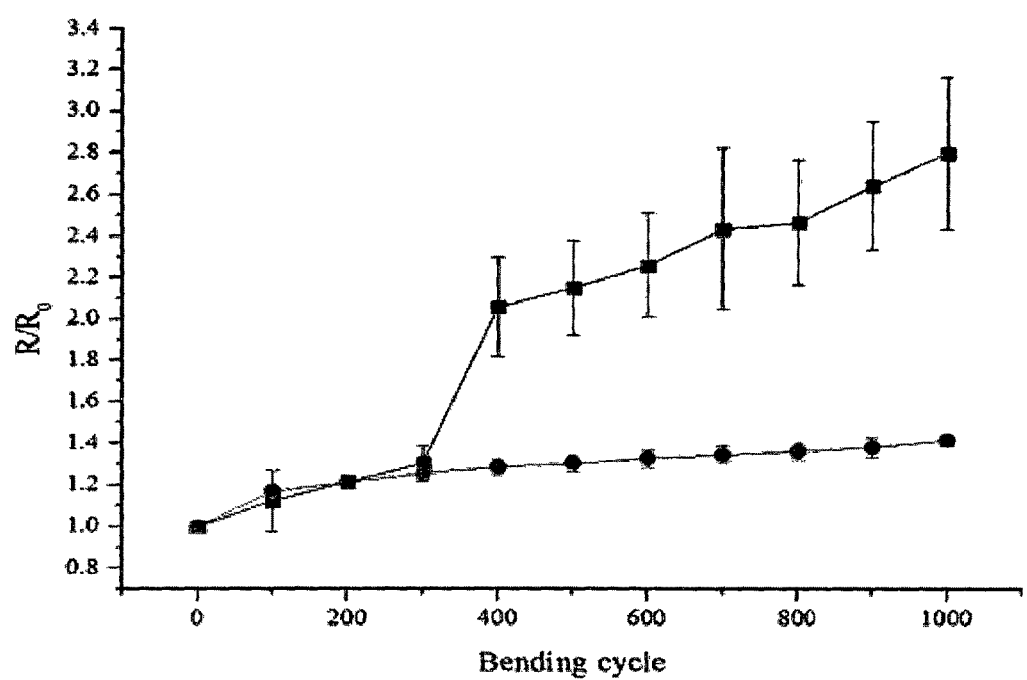

[FIG. 5]
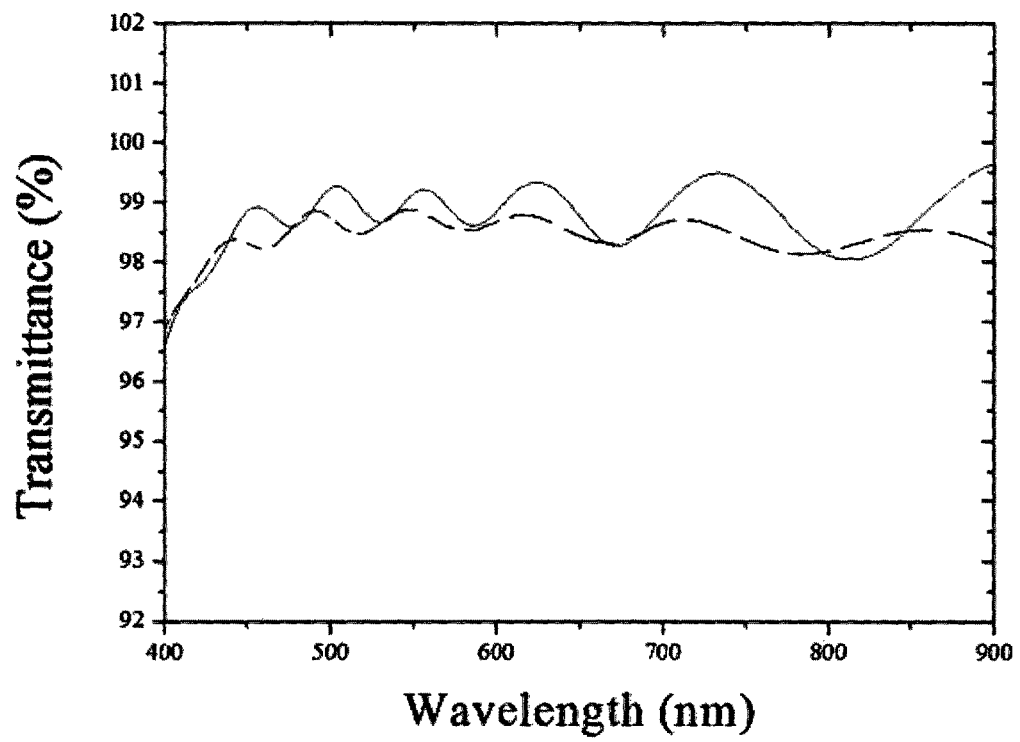

[FIG. 6]

PRODUCTION METHOD FOR TRANSPARENT ELECTRICALLY-CONDUCTIVE FILM USING MULTISTAGE LIGHT IRRADIATION

TECHNICAL FIELD

The present invention relates to a production method for a transparent electrically-conductive film, and more particularly, to a production method for a transparent electrically-conductive film capable of having excellent electrical conductivity and high transparency, securing uniform electrical properties even in a large area, and being safely operated for a long period of time in spite of repetitive physical deformation.

BACKGROUND ART

A transparent electrode has been widely used in various industrial fields such as a thin film transistor (TFT) element, a solar cell, a touch screen, and the like.

According to the related art, a material for the transparent electrode, indium tin oxide (ITO) is mainly used, but there are problems such as depletion of indium and process complexity. In addition, since deposition of ITO is mostly performed by a thin film deposition process, there are problems in that a process cost is expensive, and cracks occur due to formation of a dense thin film having a crystalline structure. Therefore, ITO has a disadvantage in that ITO is not suitable for a transparent electrode using a flexible substrate using polymers, which is recently spotlighted. Recently, as a material for replacing an ITO transparent material, silver nanowires have been spotlighted.

Meanwhile, a production method for a flexible transparent electrode is largely divided into a method using metal ink to utilize nano mesh and a method using metal nanowires represented by silver nanowires. Among them, a core technology in the case of producing a transparent electrode by seating metal nanowires on a flexible substrate is an adhesion method for the metal nanowires.

As an example, according to the related art, in order to adhere the metal nanowires, a method of applying high heat (200 to 350° C.) in an inert gas, a laser irradiation method, or a chemical method was used. However, these methods have disadvantages in that a long time is consumed, a melting point is low, and it is impossible to use these methods in a polymer substrate which may cause chemical reactions. Further, a technology for producing a transparent electrode by adhering silver nanowires using light sintering was disclosed in Korean Patent Laid-Open Publication No. 2012-0092294, but sheet resistance uniformity is deteriorated, such that there is a limitation in commercializing this method.

Further, at the time of coating metal nanowires on a substrate to form a film, it is important to uniformly coat the metal nanowires. In general, it is known that since the metal nanowires including silver nanowires have strong cohesive force between themselves, in the case of dispersing the metal nanowires in a solvent such as water, Or the like, it is difficult to obtain uniform dispersibility, and particularly, in the case of coating the metal nanowires on a substrate to dry the coated metal nanowires, as a solvent volatilizes first, the metal nanowires are aggregated with each other, such that, it is difficult to uniformly form the metal nanowires forming a surface coating layer on the substrate, and as a result, it is significantly difficult to provide a transparent electrode film having uniform sheet resistance on an entire surface thereof.

Therefore, in order to provide a transparent electrode capable of being applied as a flexible transparent electrode using a polymer material and having uniform sheet resistance on an entire surface thereof, there is a need to develop a transparent electrode film capable of being adhered within a significantly short time at room temperature under atmospheric conditions and having improved sheet resistance uniformity without affecting other components through chemical reactions.

DISCLOSURE

Technical Problem

An object of the present invention is to provide a production method for a transparent electrically-conductive film capable of having excellent electrical conductivity and high transparency, securing uniform electrical properties even in a large area, and being safely operated for a long period of time in spite of repetitive physical deformation.

Technical Solution

In one general aspect, a production method for a transparent electrically-conductive film includes: a) a coating step of coating an electrically-conductive nanowire dispersion containing electrically-conductive nanowires with an optical activity and an organic binder onto a substrate; b) a first light irradiation step of irradiating a first light including a first ultraviolet (UV) light onto the coated electrically-conductive nanowires; and c) a second light irradiation step of irradiating a second light including a pulse-type first white light onto the electrically-conductive nanowires.

The optical activity may be a surface plasmon activity or photo-catalytic activity.

The organic binder may be a natural or synthetic polymer having a molecular weight (Mw) of $5\times10^5$ or less.

The production method may further include, after step a) but at least before step b), a third light irradiation step of irradiating a third light including an infrared (IR) light to the coated electrically-conductive nanowires.

The second light may further include a second UV light.

The first light may further include a pulse-type second white light.

The organic binder existing at least in contact regions between the electrically-conductive nanowires coated onto the substrate may be decomposed and removed by the first light.

At the time of irradiating the first light, the organic binder existing in the contact regions between the electrically-conductive nanowires may be selectively removed.

An intensity of the first UV light may satisfy the following Correlation Equation 1.

$$I_{IR}(\exp) < I_{IR}(0) \qquad \text{(Correlation Equation 1)}$$

In Correlation Equation 1, $I_{IR}(\exp)$ is an intensity of the first UV light at the time of irradiating the first light, and $I_{IR}(0)$ is a maximum intensity when a weight decrease rate according to Correlation Equation 2 is 1% or less at the time of irradiating the first UV light for 1 minute on a film of the organic binder.

$$(M_0 - M_1)/M_0 * 100 \qquad \text{(Correlation Equation 2)}$$

In Correlation Equation 2, $M_1$ is a weight of the film of the organic binder defined in Correlation Equation 1 after irradiating the first UV light, and $M_0$ is a weight of the film of the organic binder defined in Correlation Equation 1 before irradiating the first UV light.

The first and second white lights may each include a light having a wavelength corresponding to an absorption peak of the electrically-conductive nanowires in ultraviolet-visible spectra of the electrically-conductive nanowires.

The second white light may satisfy the following Correlation Equation 3.

$$I_{IPL2}(\exp) < I_{IPL2}(0) \quad \text{(Correlation Equation 3)}$$

In Correlation Equation 3, $I_{IPL2}(\exp)$ is an intensity of the second white light at the time of irradiating the first light, and $I_{IPL2}(0)$ is a minimum intensity when fusion occurs in contact regions between the electrically-conductive nanowires at the time of applying a single pulse of the second white light with a pulse width of 10 msec to a reference substrate formed by coating and drying a reference dispersion which is the same as the electrically-conductive nanowire dispersion except for not containing the organic binder.

Irradiation of the second white light may be multi-pulse irradiation.

The first white light may satisfy the following Correlation Equation 4.

$$I_{IPL1}(0) \leq I_{IPL1}(\exp) < I_{IPL1}(c) \quad \text{(Correlation Equation 4)}$$

In Correlation Equation 4, $I_{IPL1}(\exp)$ is an intensity of the first white light at the time of irradiating the second light, $I_{IPL1}(0)$ is a minimum intensity when fusion is generated in contact regions between the electrically-conductive nanowires at the time of applying a single pulse of the first white light with a pulse width of 10 msec to a reference substrate formed by coating and drying a reference dispersion which is the same as the electrically-conductive nanowire dispersion except for not containing the organic binder, and $I_{IPL1}(c)$ is a minimum intensity when one electrically-conductive nanowire is cut into two or more nano-structures by partial melting in a major axis direction of the electrically-conductive nanowire at the time of applying the single pulse of the first white light with the pulse width of 10 msec to the reference substrate.

A single pulse of the first white light may be irradiated.

Fusion is generated in contact regions between the electrically-conductive nanowires by the second light.

The organic binder remaining on the substrate after irradiating the first light may be removed by the second light.

In the second light irradiation step, the first white light may be irradiated simultaneously with or during the irradiation of the second UV light.

The first and second lights may be each independently or continuously irradiated.

Intensities of the first and second UV lights may be each independently 0.1 to 5 mW/cm$^2$.

Irradiation times of the first and second UV lights may be each independently 1 to 100 seconds.

An intensity of the second white light may be 300 to 1000 W/cm$^2$.

An intensity of the first white light may be 2000 to 3000 W/cm$^2$.

The electrically-conductive nanowire dispersion may contain 0.1 to 5 wt % of the organic binder.

The organic binder may be a polysaccharide, the polysaccharide being glycogen, amylose, amylopectin, callose, agar, algin, alginate, pectin, carrageenan, cellulose, chitin, chitosan, curdlan, dextran, fructane, collagen, gellan gum, gum Arabic, starch, xanthan, gum tragacanth, carayan, carabean, glucomannan, or a combination thereof; or a polysaccharide derivative, the polysaccharide derivative being a cellulose ester or cellulose ether.

The organic binder may be carboxy-C1-C3-alkyl cellulose, carboxy-C1-C3-alkyl hydroxy-C1-C3-alkyl cellulose, C1-C3-alkyl cellulose, C1-C3-alkyl hydroxy-C1-C3-alkyl cellulose, hydroxy-C1-C3-alkyl cellulose, mixed hydroxy-C1-C3-alkyl cellulose, or a cellulose ether corresponding to a mixture thereof.

The organic binder may include polyethylene glycol (PEG), polyvinyl pyrrolidone (PVP), polyvinyl alcohol (PVA), or a mixture thereof.

The electrically-conductive nanowires may be nanowires of one or two or more selected from gold, silver, copper, lithium, aluminum, and an alloy thereof.

The electrically-conductive nanowires may be nanowires of a metal oxide including titanium oxide.

An aspect ratio of the electrically-conductive nanowires may be 50 to 20000.

The substrate may be a rigid substrate or flexible substrate.

The substrate may be a multilayer substrate in which two or more materials different from each other are stacked while forming layers.

In another general aspect, there is provided a transparent electrically-conductive film produced by the production method as described above.

In another general aspect, a transparent electrically-conductive film includes an electrically-conductive nanowire network in which electrically-conductive nanowires are melted to thereby be bound to each other in contact regions between the electrically-conductive nanowires, wherein sheet resistance uniformity defined by the following Correlation Equation 6 is 90% or more, based on a large-area electrically-conductive nanowire network having an area of at least 20 mm×20 mm.

$$\text{Sheet resistance uniformity (\%)} = [1 - (\text{standard deviation of sheet resistance})/\text{average sheet resistance})] \times 100 \quad \text{(Correlation Equation 6)}$$

At the time of performing a bending test on the transparent electrically-conductive film 1000 times at a radius of curvature of 1cm, a sheet resistance increase rate defined by the following Correlation Equation 7 may be 1.4 or less.

$$\text{Sheet resistance increase rate} = \text{sheet resistance after bending test/sheet resistance before bending test} \quad \text{(Correlation Equation 7)}$$

Advantageous Effects

A production method for a transparent electrically-conductive film according to the present invention may provide a large-area transparent electrically-conductive film having excellent sheet resistance uniformity of 90 to 95%, such that the production method may be commercially and effectively used in various electronic device fields such as a thin film transistor (TFT) device, a solar cell, a touch screen, a flexible transparent electrode, and the like.

Further, in the production method according to the present invention, a transparent electrically-conductive film having excellent transparency and low sheet resistance may be produced within an extremely short time at room temperature under atmospheric conditions without damages in a polymer substrate which is vulnerable to heat, such that the production method may be easily applied to a roll-to-roll process and enable mass-production of a flexible transparent electrode.

Furthermore, in the production method according to the present invention, even in the case of performing a bending test 1000 times at a radius of 10 mm, sheet resistance is significantly stably maintained, and a substrate and an electrically-conductive nanowire network are strongly bound to each other, thereby making it possible to produce a transparent electrically-conductive film having a significantly improved lifespan.

DESCRIPTION OF DRAWINGS

FIG. 1 is a graph illustrating average sheet resistances of dried films obtained by coating and drying a dispersion not containing a binder, a dispersion containing 0.07 wt % of the binder, a dispersion containing 0.15 wt % of the binder, and a dispersion containing 0.3 wt % of the binder and a deviation thereof.

FIG. 2 is a graph illustrating results obtained by measuring an average sheet resistance after irradiating a first light (UV irradiation of FIG. 2) and an average sheet resistance after irradiating a second light (IPL irradiation of FIG. 2) based on an average sheet resistance (100%) (No irradiation of FIG. 2) after irradiating a near infrared lamp in Example 1.

FIG. 3 is a graph illustrating results obtained by measuring an average sheet resistance after irradiating a first light and an average sheet resistance after irradiating a second light based on an average sheet resistance (100%) (No irradiation of FIG. 2) after irradiating a near infrared lamp in Example 2.

FIG. 4 is a graph illustrating a bending test result (represented by a square in FIG. 4) of a film obtained only by performing drying and irradiation of the first light in Example 2 and a bending test result (represented by a circle in FIG. 4) of a transparent electrically-conductive film produced through Example 2.

FIG. 5 is a graph illustrating light transmittance of the film obtained only by performing drying and irradiation of the first light in Example 2 and light transmittance of the transparent electrically-conductive film produced through Example 2.

FIG. 6 is a scanning electron microscope photograph of silver nanowires produced in Comparative Example.

BEST MODE

Hereinafter, a production method for a transparent electrically-conductive film and a transparent electrically-conductive film according to the present invention will be described in detail. Here, technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

While conducting research for replacing a transparent electrode according to the related art, represented by an indium tin oxide (ITO) electrode, with an electrically-conductive nanowire network, the present applicant noticed that in order to commercially use the electrically-conductive nanowire network as a transparent electrode, first of all, there is a need to develop a technology capable of producing an electrically-conductive nanowire network having sheet resistance uniformity even in a large area. Based on the technical motive as described above, the present applicant conducted further studies for a long period of time in order to produce an electrically-conductive nanowire network capable of being easily and rapidly produced on a flexible substrate vulnerable to heat while having sheet resistance uniformity, and capable of having excellent binding strength with the substrate to stably maintain electrical conductivity even though the electrically-conductive nanowire network is repeatedly and severely bent.

During the studies as described above, the present applicant noticed that in order to cheaply mass-produce an electrically-conductive nanowire network on a flexible substrate vulnerable to heat in a short period of time while preventing the substrate from being damaged, light sintering is preferable, and in order to have sheet resistance uniformity in a large area, essentially, uniform dispersion of electrically-conductive nanowires on the substrate should be induced through a binder.

However, it was found that in the case of dispersing and binding the electrically-conductive nanowires on the substrate using the binder, it is almost impossible to perform a light sintering process in which nanowires are not damaged but contact regions between nanowires are partially melted and bound to each other through a technology known in the art such as a light sintering technology using a xenon lamp, and it is also impossible to secure the desired sheet resistance uniformity, such that the binder should be necessarily pre-removed prior to the light sintering. As a result of conducting further studies as described above, the present applicant found that in the case of pre-removing all binders (pre-removing means removing the binders prior to the light sintering step) through plasma, or the like, contacts between nanowires may be rather decreased by heat stress and deformation generated when the contact regions between the nanowires are melted and bound to each other, and binding strength with the substrate was also decreased, but an electrically-conductive nanowire network having excellent electrical conductivity while having the desired sheet resistance uniformity and excellent binding strength with the substrate may be produced without damages of a substrate even on a substrate significantly vulnerable to heat by sequentially removing the binder through multi-stage light irradiation, preferably, multi-stage light irradiation using composite lights, thereby completing the present invention.

A production method for a transparent electrically-conductive film according to the present invention includes: a) a coating step of coating an electrically-conductive nanowire dispersion containing electrically-conductive nanowires with an optical activity and an organic binder onto a substrate; b) a first light irradiation step of irradiating a first light including a first ultraviolet (UV) light onto the coated electrically-conductive nanowires; and c) a second light irradiation step of irradiating a second light including a pulse-type first white light onto the electrically-conductive nanowires irradiated with the first UV light.

That is, in the production method according to the present invention, light irradiation is performed in a multi-stage process, and multi-stage light irradiation includes the first light irradiation in step b) and the second light irradiation of step c), which are sequentially performed. In detail, the multi-stage light irradiation includes a pre-removing step of irradiating the first light including the first UV light to remove the organic binder existing at least in contact regions between the electrically-conductive nanowires (including intersection regions between the electrically-conductive nanowires) and a fusion step of irradiating the second light including the first white light to melt and bind the contact regions between the electrically-conductive nanowires to each other. In this case, when the first light irradiation and the second light irradiation are independently and sequentially performed, a resting period may exist between the first light irradiation and the second light irradiation.

As described above, in the production method according to an exemplary embodiment of the present invention, the first light irradiated at the time of irradiating the first light includes the first ultraviolet (UV) light, and the organic binder contained in the electrically-conductive nanowire dispersion to thereby be coated onto the substrate together with the electrically-conductive nanowires may be removed by the first UV light. In detail, the organic binder existing at least in contact regions between the electrically-conductive nanowires may be partially or entirely decomposed and removed by the first light.

First UV light mean a light having a wavelength in a range of 10 nm to 400 nm, and as known, since UV rays cause significantly strong chemical actions, the UV rays are also referred to chemical rays. The first UV light may include a UV-A light in a wavelength band of 320 to 400 nm, a UV-B light in a wavelength band of 280 to 320 nm, a UV-C light in a wavelength band of 100 to 280 nm, or a combination thereof. In this case, the first UV light may include the UV-C which is more effective in decomposing an organic material. Here, unless an irradiation type of light to be irradiated such as a pulse type is particularly described, all of the lights irradiated in the present invention may be continuous lights continuously irradiated for a predetermined time. For example, since an irradiation type of the first UV light is not particularly limited, the first UV light may also be continuously irradiated.

As described above, in the case in which the organic binder coated onto the substrate together with the electrically-conductive nanowires is entirely decomposed and removed by the first light, at the time of fusion of the electrically-conductive nanowires by the second light, binding strength with the substrate may be decreased due to distortion of the electrically-conductive nanowires, and sheet resistance of the electrically-conductive nanowire network may be increased. In order to prevent this problem, it is preferable that the organic binder existing in the contact regions between the electrically-conductive nanowires is selectively removed by the first light. In this case, selective removal of the organic binder existing in the contact regions means that the organic binder may remain on the substrate even after the first light is irradiated, and further means a state in which the electrically-conductive nanowires are bound to the substrate by the organic binder in regions except for the contact regions.

Selective removal of the organic binder existing in the contact regions may be performed by irradiating the first UV light so that the organic binder may not be removed by the first light itself, in detail, the first UV light itself included in the first light, but may be removed only when generation of surface plasmon or optical activities of the electrically-conductive nanowires having a photo-catalytic activity are combined with the first UV light.

That is, the electrically-conductive nanowires with optical activities may mean electrically-conductive nanowires on which surface plasmon is generated and/or electrically-conductive nanowires having photo-catalytic activity, and the optical activities provided by these electrically-conductive nanowires are combined with the first UV light, such that the organic binder positioned in the contact regions may be selectively removed.

Here, as well-known in a plasmonic field, the surface plasmon means a phenomenon that plasmon, collective movement of free electrons of a metal, is intensively formed on a surface of a metal structure by interactions between a metal corresponding to a structure having a nano dimension and light. As the electrically-connective nanowires on which the surface plasmon is generated, any metal nanowires known to generate surface plasmon may be used. As a specific example, the electrically-connective nanowires with the surface plasmon may be nanowires of one or two or more materials selected from gold, silver, copper, lithium aluminum, and an alloy thereof, but the present invention is not limited thereto.

The photo-catalytic activity may mean an activity of receiving photo energy to promote a chemical reaction. Here the chemical reaction may be a decomposition reaction of an organic material, and the photo-catalytic activity may mean a photo-catalytic activity for decomposing the organic material. The electrically-conductive nanowires having the photo-catalytic activity may provide an electron or hole transport path, and any material nanowires known to promote a chemical reaction by light may be used. Specific example of electrically-conductive nanowires providing the electron transport path and having the photo-catalytic activity may include nanowires of one or more metal oxides selected from titanium oxide, zinc oxide, tin oxide, and the like, and specific examples of the electrically-conductive nanowires made of a metal and having the photo-catalytic activity may include nanowires of noble metals including gold, silver, platinum, and the like, but the present invention is not limited thereto.

Further, the electrically-conductive nanowires with surface plasmon may be interpreted to have both the surface plasmon and the photo-catalytic activity, which is consistent with a known fact that an anisotropic material with surface plasmon has a photo-catalytic activity.

In order to allow the organic binder not to be removed by the first light itself, specifically, the first UV light itself included in the first light but to be removed by the first light only in the presence of the optical activity provided by the electrically-conductive nanowires, an intensity of the first UV light at the time of irradiating the first light may satisfy the following Correlation Equation 1.

$$I_{IR}(\exp) < I_{IR}(0) \qquad \text{(Correlation Equation 1)}$$

In Correlation Equation 1, $I_{IR}(\exp)$ is an intensity of the first UV light at the time of irradiating the first light, and $I_{IR}(0)$ is a maximum intensity when a weight decrease rate according to Correlation Equation 2 is 1% or less at the time of irradiating the first UV light for 1 minute on a film of the organic binder. Here, as the film of the organic binder, any film may be used as long as it has a thickness suitable for measuring the weight decrease rate. As a non-restrictive example, the film may be a film having a thickness of 100 to 800 nm.

$$(M_0 - M_1)/M_0 * 100 \qquad \text{(Correlation Equation 2)}$$

In Correlation Equation 2, $M_1$ is a weight of the film of the organic binder defined in Correlation Equation 1 after irradiating the first UV light, and $M_0$ is a weight of the film of the organic binder defined in Correlation Equation 1 before irradiating the first UV light.

That is, as shown in Correlation Equations 1 and 2, it is preferable that the first UV light is irradiated at an intensity at which substantially, the organic binder is hardly decomposed and removed (the weight decrease rate according to Correlation Equation 2 is 1% or less) only by irradiating the first UV light for 1 minute when the organic binder contained in the electrically-conductive nanowire dispersion is not mixed with the electrically-conductive nanowires but forms the film of the pure organic binder. The intensity satisfying Correlation Equation 1 in some degree may be determined depending on the kind of organic binder.

However, as described below, the organic binder may be selectively removed due to the intensity of the first UV light as described above, and particularly, in the case of producing the transparent electrically-conductive film on a thermally or chemically vulnerable substrate, it is possible to basically prevent the substrate from being damaged by UV light.

It is preferable that the organic binder existing in the contact regions between the electrically-conductive nanowires, in detail, the organic binder positioned on a point of contact between one electrically-conductive nanowire and another electrically-conductive nanowire forming the point of contact is entirely removed as possible by irradiating first light including the first UV light.

However, since it is impossible to ignore shading by the nanowires, it may be difficult to perfectly remove the organic binder interposed and positioned between two nanowires. In the case in which an irradiation time of the first UV light is excessively extended in order to entirely remove the organic binder in the contact regions, productivity may be deteriorated, and there may be a risk that the substrate will be damaged by photo energy accumulated with the passage of time. In consideration of substantial productivity of a continuous process including a roll-to-roll process, it is not preferable that the irradiation time of the first UV light is over several minutes.

Therefore, in order to remove the organic binder positioned in the contact regions using the first UV light and the optical activities of the electrically-conductive nanowires but to more perfectly remove the organic binder positioned in the contact regions while irradiating the first UV light for a short time, the first light may further include a pulse-type second white light in addition to the first UV light.

That is, in the production method according to the exemplary embodiment of the present invention, the first light may further include the pulse-type second white light in addition to the first UV light.

The pulse-type second white light may serve to further promote decomposition of the organic binder by the first UV light. In general, it is known that in order to suitably perform roles of a binder, a polymer organic material having a large molecular weight is more suitable for the binder than a monomer organic material. The polymer organic material as described above has significantly wide physical properties as compared to a monomer, and cannot but slowly be decomposed and removed as compared to the monomer due to peculiar properties of a polymer.

In the case of instantly supplying strong energy several times through the pulse-type second white light while the organic binder is decomposed by the first UV light in the presence of the optical activity provided by the electrically-conductive nanowires, even though the organic binder is a polymer organic binder, it is possible to significantly improve a decomposition rate thereof.

Particularly, in the case in which the electrically-conductive nanowires are metal nanowires on which surface plasmon is generated, when the pulse-type second white light is simultaneously irradiated at the time of irradiating the first light including the first UV light, the organic binder existing in the contact regions between the electrically-conductive nanowires may be more perfectly removed by hot spots, which are the contact regions between the electrically-conductive nanowires, and it is possible to prevent the organic binder existing in other regions except for the contact regions from being damaged (decomposed). In this case, as well-known in the plasmonic field, the hot-spot means a region at which a significantly strong local magnetic field is formed, and means a point of contact, a nano gap, or the like, between nano-structures of the metal on which surface plasmon is generated.

The second white light may mean a light including a visible light including, red, green, blue lights and mean a light having a continuous wavelength band of at least 430 nm to 600 nm, specifically, from at least 400 nm to 800 nm, and more specifically from at least 350 nm to 950 nm. For example, a second white light source may be a xenon lamp, but the present invention is not limited by light source of the white light.

In the production method according to the exemplary embodiment of the present invention, the second white light may be based on a visible light, specifically, the light having a wavelength band of at least 430 nm to 600 nm, specifically, from at least 400 nm to 800 nm, and more specifically, from at least 350 nm to 950 nm, and include a light having a wavelength (hereinafter, a nanowire absorption wavelength) corresponding to an absorption peak of the electrically-conductive nanowires, in ultraviolet-visible spectra of the electrically-conductive nanowires. More specifically, in the case in which the nanowire absorption wavelength is in a wavelength range of visible light, specifically, in a range of 430 nm to 600 nm, more specifically, 400 nm to 800 nm, and further more specifically, 350 nm to 950 nm, the second white light may be light formed from a white light source generating light having the nanowire absorption wavelength, but in the case in which the nanowire absorption wavelength is different from the wavelength of the above-mentioned white light, the second white light may be a light formed by a combination of the white light source and another light source generating a light having the nanowire absorption wavelength.

The pulse-type second white light for promoting decomposition of the organic binder existing in the contact regions to more effectively and selectively remove the organic binder in the contact regions may satisfy the following Correlation Equation 3.

$$I_{IPL2}(\exp) < I_{IPL2}(0) \qquad \text{(Correlation Equation 3)}$$

In Correlation Equation 3, $I_{IPL2}(\exp)$ is an intensity of the second white light at the time of irradiating the first light, and $I_{IPL2}(0)$ is a minimum intensity when fusion is generated in the contact regions between the electrically-conductive nanowires at the time of applying a single pulse of the second white light with a pulse width of 10 msec to a reference substrate formed by coating and drying a reference dispersion which is the same as the electrically-conductive nanowire dispersion except for not containing the organic binder. In more detail, $I_{IPL2}(0)$ is the minimum intensity when fusion is generated in the contact regions between the electrically-conductive nanowires at the time of applying a single pulse of the second white light with a pulse width of 10 msec to the reference substrate formed by coating and drying a reference dispersion composed of the electrically-conductive nanowires and a dispersion medium.

That is, it is preferable that after the organic binder existing in the contact regions is pre-decomposed and removed by the first light, fusion is generated in the contact regions by the second light as a step independent of decomposition of the organic binder. Therefore, it is preferable that the pulse-type second white light included in the first light is irradiated at an intensity at which decomposition of the organic binder is promoted, but partial melting of the electrically-conductive nanowires is not generated in the contact regions of the electrically-conductive nanowires, as shown in Correlation Equation 3.

It is preferable that irradiation of the second white light is multi-pulse irradiation. The reason is that a pulse of the second white light satisfying Correlation Equation 3 is irradiated two times or more at a predetermined interval, such that the organic binder may be more rapidly decomposed and removed as compared to single-pulse irradiation. Multi-pulse irradiation means that the number of pulse to be irradiated is 2 or more, specifically, 2 to 50, and more specifically, 2 to 20, but the present invention is not limited by the number of pulse of the second white light to be irradiated. That is, the number of pulse of the second white light to be irradiated may be suitably adjusted depending on the material of the organic binder.

As described above, the first light may include the pulse-type second white light in addition to the first UV light. At the time of irradiating the first light, the first UV light is continuously irradiated, and the pulse-type second white light may be irradiated simultaneously with or during the irradiation of the first UV light or directly before the irradiation of the first UV light is stopped. In this case, when a total irradiation time of the first UV light is $t_{uv1}$, based on a point in time at which the irradiation of the first UV light is initiated, a point in time at which the pulse-type second white light is irradiated may be the same as that in the irradiation of the first UV light or may be within $0.9\ t_{uv1}$.

In the case of irradiating the first light including the pulse-type second white light in addition to the first UV light, an irradiation time of the first UV light may be significantly decreased to 1 to 100 seconds, specifically, 1 to 60 seconds, and more specifically, 1 to 20 seconds ($t_{uv1}$), and the organic binder in the contact regions may be more perfectly removed.

After performing the first light irradiation step of irradiating the first light including the first UV light onto the coated electrically-conductive nanowires, the second light irradiation step of irradiating the second light including the pulse-type first white light onto the electrically-conductive nanowires on the substrate may be performed.

The contact regions between the electrically-conductive nanowires are melted and bound to each other by the second light irradiation step, such that the electrically-conductive nanowires may be physically integrally bound to each other.

The first white light may mean light including a visible light including red, green, and blue lights, independently of the above-mentioned second white light, and mean light having a continuous wavelength band of at least 430 nm to 600 nm, specifically, from at least 400 nm to 800 nm, and more specifically from at least 350 nm to 950 nm. For example, a light source of the first white light may be a xenon lamp, but the present invention is not limited by the light source of the white light.

Further, the first white light may include light having a wavelength (a nanowire absorption wavelength) corresponding to the absorption peak of the electrically-conductive nanowires, in the ultraviolet-visible spectra of the electrically-conductive nanowires, equally or similarly to the second white light described above.

The first white light causing binding (fusion) by partial melting in the contact regions between the electrically-conductive nanowires may satisfy the following Correlation Equation 4.

$I_{IPL1}(0) \leq I_{IPL1}(\exp) < I_{IPL1}(c)$   (Correlation Equation 4)

In Correlation Equation 4, $I_{IPL1}(\exp)$ is an intensity of the first white light at the time of irradiating the second light, $I_{IPL1}(0)$ is a minimum intensity when fusion is generated in contact regions between the electrically-conductive nanowires at the time of applying a single pulse of the first white light with a pulse width of 10 msec to a reference substrate formed by coating and drying a reference dispersion which is the same as the electrically-conductive nanowire dispersion except for not containing the organic binder, and $I_{IPL1}(c)$ is a minimum intensity when one electrically-conductive nanowire is cut into two or more nano-structures by partial melting in a major axis direction of the electrically-conductive nanowire at the time of applying the single pulse of the first white light with the pulse width of 10 msec to the reference substrate. In more detail, $I_{IPL1}(0)$ is a minimum intensity when fusion is generated in the contact regions between the electrically-conductive nanowires at the time of applying the single pulse of the first white light with the pulse width of 10 msec to the reference substrate formed by coating and drying the reference dispersion composed of the electrically-conductive nanowires and a dispersion medium, and $I_{IPL1}(c)$ is a minimum intensity when one electrically-conductive nanowire is cut into two or more nano-structures by partial melting in the major axis direction of the electrically-conductive nanowire at the time of applying the single pulse of the first white light with the pulse width of 10 msec to the reference substrate formed by coating and drying the reference dispersion composed of the electrically-conductive nanowires and the dispersion medium.

That is, as described above through Correlation Equation 4, the first white light may be irradiated at an intensity at which fusion of the contact regions may be generated by single-pulse irradiation, but damages such as undesired melting of the electrically-conductive nanowires, and the like, are not generated in other regions except for the contact regions.

A condition of Correlation Equation 4 may be the same as or similar to a condition already established in a method for melting electrically-conductive nanowires through light sintering after dispersing the electrically-conductive nanowires in the dispersion medium without adopting the organic binder according to the related art. However, as described above, in the case of adopting the organic binder for uniform and homogeneous dispersion and contact of the electrically-conductive nanowires, when light sintering is performed without pre-removing the organic binder at least in the contact regions, light sintering may not be performed in a range in which the condition of Correlation Equation 4 is satisfied. That is, in the case of performing light sintering by irradiating a pulse-type white light as in the related art instead of performing multi-stage light irradiation of the first UV light and the first white light provided in the present invention after coating and drying the electrically-conductive nanowire dispersion containing the organic binder and the electrically-conductive nanowires, the electrically-conductive nanowires themselves are partially melted or deformed and damaged by adjusting the intensity, the pulse width, the number of pulse, a pulse interval, or the like, of the white light, but the desired electrically-conductive nanowire network is not produced.

That is, the condition of Correlation Equation described above is an available condition in a configuration of the multi-stage light irradiation of the first UV light and the first white light in the case of using the electrically-conductive nanowire dispersion containing the organic binder and the electrically-conductive nanowires.

As described above, since the contact regions are fused using the pulse-type first white light after pre-removing the organic binder existing in the contact regions by irradiating the first light, fusion between the electrically-conductive nanowires may be performed in the condition satisfying Correlation Equation 4. Further, since the contact regions are fused using the pulse-type first white light after pre-removing the organic binder existing in the contact regions by irradiating the first light, the single pulse of the first white light may be irradiated, and even though the single pulse of the first white light is irradiated, the contact regions may be homogeneously fused even in a large area.

When the single pulse of the pulse-type first white light satisfying Correlation Equation 4 is irradiated, a pulse width is determined in a range in which the electrically-conductive nanowires may be stably fused and the substrate is not damaged. As a specific example, the pulse width may be 5 msec to 15 msec, but the present invention is not limited by the pulse width of the first white light.

When the pulse-type first white light satisfying Correlation Equation 4 is irradiated, the contact regions between the electrically-conductive nanowires may be instantly heated to a significantly high temperature, and fusion of the electrically-conductive nanowires may be generated. When the second light is irradiated, the electrically-conductive nanowires may be in a state in which they are physically fixed to the substrate by the organic binder remaining in other regions except for the contact regions after the first light is irradiated. The second light is irradiated in the state in which these electrically-conductive nanowires are physically fixed, thereby making it possible to prevent binding strength between the electrically-conductive nanowires and the substrate from being damaged (the electrically-conductive nanowires from being delaminated) due to warpage or distortion of the electrically-conductive nanowires generated by partially non-uniformly generated heat stress (deformation).

In the production method according to the exemplary embodiment of the present invention, the second light may further include a second UV light in addition to the pulse-type first white light.

It is preferable that the second UV light continuously irradiated for a predetermined time is irradiated to the electrically-conductive nanowires at least simultaneously with irradiation of the first white light or before the irradiation of the first white light. That is, the pulse-type first white light may be irradiated during the irradiation of the second UV light. Fusion between the electrically-conductive nanowires may be generated by simultaneous irradiation of the first white light and the second UV light, and the organic binder capable of remaining on the substrate (including the electrically-conductive nanowires) even after the first light irradiation is decomposed and removed, thereby making it possible to improve transparency of the electrically-conductive film.

Further, the second light including the second UV light and the first white light is irradiated, such that even in the case of irradiating the single pulse of the first white light at a lower intensity, fusion may be stably and reproducibly generated in the contact regions.

In addition, the second light including the second UV light and the first white light is irradiated, such that binding strength between a physically integrated electrically-conductive nanowire network and the substrate may be improved. As heat generated in the contact regions at the time of irradiating the first white light irradiated together with the second UV light is transferred through the electrically-conductive nanowires, the electrically-conductive nanowire network and the substrate as described above may be bound to each other.

As described above, in the second light irradiation step, the first white light may be irradiated simultaneously with or during the irradiation of the second UV light, or directly before the irradiation of the second UV light is stopped.

In detail, in the second light irradiation step, the following Correlation Equation 5 may be satisfied.

$$0.5 * t_{uv2} \leq t_{p1} < t_{uv2}$$ (Correlation Equation 5)

In Correlation Equation 5, $t_{uv2}$ is a total irradiation time (second) of the second UV light, $t_{p1}$ is a point in time at which irradiation of the first white light is initiated, based on a point in time at which irradiation of second UV light is irradiated. Here, in Correlation Equation 5, the term "$<t_{uv2}$" means a condition for allowing the first white light to be irradiated at a point in time at which irradiation of the second UV light is stopped (that is, directly before the irradiation is stopped). That is, the first white light may be irradiated after the second UV light is already irradiated for at least $0.5 * t_{uv2}$.

An irradiation condition satisfying Correlation Equation 5 is a condition capable of improving transparency of the electrically-conductive film by removing the organic binder in addition to fusion by the first white light and capable of further enhancing binding strength between the electrically-conductive nanowires and the substrate integrally bound to each other.

The second UV light may mean a light having a wavelength in a range of 10 nm to 400 nm independently of the first UV light. The second UV light may include a UV-A light in a wavelength band of 320 to 400 nm, a UV-B light in a wavelength band of 280 to 320 nm, a UV-C light in a wavelength band of 100 to 280 nm, or a combination thereof, independently of the first UV light.

It is preferable that an intensity of the second UV light also satisfies Correlation Equation 1 as described based on first UV light. That is, it is preferable that the second UV light has an intensity at which the organic binder itself is not removed only by the second UV light, but may be removed by heat generated at the time of irradiating the second white light or the optical activities provided in the electrically-conductive nanowires. An irradiation time of the second UV light is determined in a range in which the substrate is not damaged when the second UV light is irradiated to a substrate onto which the electrically-conductive nanowire dispersion is not coated. For example, in the case of irradiating the second light including the second UV light in addition to the pulse-type first white light, the irradiation time of the second UV light may be in a range of 1 to 100 seconds, specifically 10 to 60 seconds, and more specifically, 20 to seconds ($T_{uv1}$). In this case, as described through Correlation Equation 5, it is preferable that the first white light is irradiated at a point in time at which the second UV light is continuously irradiated for at least $0.5 * t_{uv2}$.

In the production method according to the exemplary embodiment of the present invention, the first and second lights may be each independently irradiated. Unlike this, the first and second lights may also be continuously irradiated. The first and second lights are each independently irradiated, which may mean that there is a resting period in which the light is not irradiated to the electrically-conductive nanowires positioned on the substrate after the first light is irradiated. The first and second lights are continuously and sequentially irradiated, which may mean that there is no intentional resting period between the first light irradiation step and the second light irradiation step. The independent or continuous irradiation may be changed depending on the design at the time of constructing a production process line. Here, in the case in which the second light includes the second UV light and the intensity of the second UV light is the same as that of the first UV light, continuous irradiation of the first UV light of the first light and the second UV light of the second light may be implemented by continuously irradiating the UV light for a time corresponding to a sum of times $t_{uv1}$ and $t_{uv2}$. At the time of irradiating the first and second lights, in the case of continuously irradiating a UV light using a single UV lamp for a predetermined time ($t_{uv1}+t_{uv2}$), there are advantages in that it is easy to construct a process line, cost may be decreased, and it may be easy to control process parameters.

The production method according to the exemplary embodiment of the present invention may further include, after the coating of the electrically-conductive nanowire dispersion onto the substrate (step a), but at least before the irradiating of the first light (step b), a third light irradiation step of irradiating a third light including an infrared (IR) light to the coated electrically-conductive nanowires coated onto the substrate. The IR light means a light having a wavelength band of 0.75 μm to 1 mm, and as known, since IR rays have a strong heating effect as compared to the visible light or the UV light, the IR light is also referred to as heat rays. The IR light of the third light may include a near IR light having a wavelength of 0.75 μm to 3 μm, an IR light having a wavelength of 3 μm to 25 μm, a far IR light having a wavelength of 25 μm to 1 mm, or a combination thereof.

The third light serves to volatilize and remove a liquid (a solvent) existing in a coating film after the electrically-conductive nanowire dispersion is coated. That is, the third light irradiation step may be a drying step.

In the drying step by the third light including the IR light, heat transfer through the substrate is not required, such that even in the case of a substrate vulnerable to heat, it is possible to prevent the substrate from being damaged by drying, and even in the case of a coating film having a large area, the coating film may be homogeneously dried within a short time, such that the production method may be significantly suitable for a continuous process including a roll-to-roll process. An intensity and an irradiation time of the IR light may be determined in a range in which damages of the substrate may be prevented and the liquid existing in the coating film may be volatilized and removed. As a specific example, the IR light may be irradiated at an intensity of 100 to 1000 W/cm² for 5 to 50 seconds, but the present invention is not limited by the intensity and the irradiation time of the IR light to be irradiated.

In the production method according to the exemplary embodiment of the present invention, the electrically-conductive nanowire dispersion may contain the electrically-conductive nanowires, the organic binder, and a solvent.

As described above, in the production method according to the exemplary embodiment of the present invention, after partially removing the organic binder using the UV light with significantly weak energy at a level at which the organic binder is not decomposed using the first UV light alone through multi-stage light irradiation, the electrically-conductive nanowires are fused with each other by the first white light.

Therefore, it is preferable that the organic binder contained in the electrically-conductive nanowire dispersion is a natural polymer or synthetic polymer having a low molecular weight (weight average molecular weight) of $5 \times 10^5$ or less, preferably $2 \times 10^5$ or less. In the case in which the organic binder is a polymer having a large molecular weight out of the above-mentioned low molecular weight range, the organic binder existing in the contact regions may not be removed by the irradiation of the first light, and thus, it is impossible to perform the desired light sintering step in which the electrically-conductive nanowires are fused with each other to form the network at the time of subsequently irradiating the second light. Here, as a substantial example, the organic binder may have a molecular weight of 3,000 or more, but the present invention is not limited by the lower limit of the molecular weight of the organic binder.

As the organic binder having a low molecular weight, one or two or more may be selected from polyethylene glycol (PEG), polyvinyl pyrrolidone (PVP), polyvinyl alcohol (PVA), polysaccharides, and polysaccharide derivatives.

More preferably, as the organic binder, one or two or more may be selected from low-molecular weight polyethylene glycol (PEG) having a molecular weight of 3,000 to 50,000, preferably, 3,000 to 20,000, low-molecular weight polyvinyl pyrrolidone (PVP) having a molecular weight of 3,000 to 60,000, low-molecular weight polyvinyl alcohol (PVA) having a molecular weight of 3,000 to 50,000, low-molecular weight polysaccharides having a molecular weight of 3,000 to 200,000, preferably 3,000 to 100,000, and low-molecular weight polysaccharide derivatives having a molecular weight of 3,000 to 200,000, preferably 3,000 to 100,000.

An example of the low-molecular weight polysaccharide may include glycogen, amylose, amylopectin, callose, agar, algin, alginate, carrageenan, pectin, cellulose, chitin, chitosan, curdlan, dextran, fructane, collagen, gellan gum, gum Arabic, starch, xanthan, gum tragacanth, carayan, carabean, glucomannan, or a combination thereof. An example of the polysaccharide derivative may include a cellulose ester or cellulose ether.

More preferably, the organic binder may be a low-molecular weight cellulose ether, wherein the cellulose ether may include carboxy-C1-C3-alkyl cellulose, carboxy-C1-C3-alkyl hydroxy-C1-C3-alkyl cellulose, C1-C3-alkyl cellulose, C1-C3-alkyl hydroxy-C1-C3-alkyl cellulose, hydroxy-C1-C3-alkyl cellulose, mixed hydroxy-C1-C3-alkyl cellulose, or a mixture thereof.

As an example, the carboxy-C1-C3-alkyl cellulose may include carboxymethyl cellulose, or the like; the carboxy-C1-C3-alkyl hydroxy-C1-C3-alkyl cellulose may include carboxymethyl hdyroxyethyl cellulose, or the like; the C1-C3-alkyl cellulose may include methyl cellulose, or the like; the C1-C3-alkyl hydroxy-C1-C3-alkyl cellulose may include hydroxylethylmethyl cellulose, hydroxypropylmethyl cellulose, ethylhydroxyethyl cellulose, a combination thereof, or the like; the hydroxy-C1-C3-alkyl cellulose may include hydroxyethyl cellulose, hydroxypropyl cellulose, or a combination thereof; and the mixed hydroxy-C1-C3-alkyl cellulose may include hydroxyethylhydroxypropyl cellulose, alkoxyhydroxyethylhydroxypropyl cellulose (the alkoxy group is a straight or branched chain and contains 2 to 8 carbon atoms), or the like.

The electrically-conductive nanowire dispersion according to the exemplary embodiment of the present invention may contain the organic binder in a content of 0.1 to 5 wt %, preferably, 0.1 to 1 wt %, and more preferably 0.1 to 0.7 wt %. The content of the organic binder is a content at which at the time of coating the electrically-conductive nanowire dispersion, the electrically-conductive nanowires may be uniformly and homogeneously coated onto the substrate, the organic binder existing between the electrically-conductive nanowires in the contact regions may be minimized, and thus, the organic binder existing at least in the contact regions may be stably removed by the above-mentioned first light irradiation.

An aspect ratio and a content of the electrically-conductive nanowires contained in the electrically-conductive nanowire dispersion may be determined in a range in which the electrically-conductive nanowires may come in a contact with each other to form a network capable of providing a stable current transport path without decreasing transparency. As a specific example, the aspect ratio of the electrically-conductive nanowires may be 50 to 20,000. As a more specific example, the electrically-conductive nanowires may have an average minor axis diameter of 5 to 100 nm, and an average length of 5 μm to 100 μm. As a specific example, the electrically-conductive nanowire dispersion may contain 0.01 to 70 parts by weight of the electrically-conductive nanowires based on 100 parts by weight of the solvent.

As the solvent contained in the electrically-conductive nanowire dispersion, any solvent may be used as long as it may dissolve the organic binder, serves as a dispersion medium of the electrically-conductive nanowires, and is easily volatilized and removed. As a specific example, the solvent may be 2-butoxyethyl acetate, propylene glycol monomethylether acetate, diethylene glycol monoethylether acetate, ethylene glycol butyl ether, cyclohexanone, cyclohexanol, 2-ethoxyethyl acetate, ethylene glycol diacetate, terpineol, isobutyl alcohol, water, or a mixed solution thereof, but the present invention is not limited by the kind of solvent contained in the electrically-conductive nanowire dispersion.

As a coating method for the electrically-conductive nanowire dispersion, any method may be used as long as it is used to produce a film having a uniform thickness by coating and drying a liquid (including ink or slurry) in which a solid is dispersed in a semiconductor or display production field. For example, there are various methods such as a coating method, a spray method, a printing method, and the like. As a specific example, a spin coating method, a screen printing method, an ink-jet printing method, a bar coating method, a gravure coating method, a blade coating method, a roll coating method, a slot die method, a spray method, or the like, may be used, but the present invention is not limited by the coating method for the electrically-conductive nanowire dispersion.

In the production method according to the exemplary embodiment of the present invention, the substrate may mean an insulating substrate, and may be a rigid or flexible substrate in view of physical properties. The substrate may be suitably selected depending on purposes of the transparent electrically-conductive film. An example of the substrate may include a rigid substrate such as glass, polycarbonate, or acrylic polyethylene terephthalate, or a flexible substrate, for example, a polyester based substrate such as polyester naphthalate and polycarbonate, a polyolefin based substrate such as linear, branched, and cyclic polyolefins, a polyvinyl based substrate such as polyvinyl chloride, polyvinylidene chloride, polyvinyl acetal, polystyrene, and polyacryl, a cellulose ester salt substrate such as cellulose triacetate Or cellulose acetate, a polysulfone substrate such as polyester sulfone, a polyimide substrate, or a silicon substrate.

In the production method according to the exemplary embodiment of the present invention, the substrate may be a single layer substrate in which one material forms a single layer or a multilayer substrate in which two or more materials different from each other are stacked while forming layers. The multilayer substrate may include a main substrate and a coating layer formed on a surface of the main substrate.

Hereinafter, a specific example of the above-mentioned multi-stage light irradiation will be provided based on Correlation Equations 1 to 5. The following Examples are derived from the spirit of the present invention described above, and those working in producing a transparent electrode using electrically-conductive nanowires may deduce conditions for implementing effects corresponding to effects obtained in suggested Examples through repetitive experiments based on the spirit of the present invention.

In the case in which the organic binder is the above-mentioned natural or synthetic polymer having a low molecular weight, preferably, in the case in which the organic binder is one or two or more selected from the low-molecular weight polyethylene glycol (PEG), polyvinyl pyrrolidone (PVP), polyvinyl alcohol (PVA), polysaccharides, and polysaccharide derivatives, the first UV light of the first light may be irradiated at an intensity of 0.1 to 5 m W/cm$^2$ for 1 to 100 seconds, specifically, 1 to 60 seconds, and more specifically, 1 to 20 seconds.

In the case in which the organic binder is the above-mentioned natural or synthetic polymer having a low molecular weight, preferably, it is preferable that the organic binder is one or two or more selected from the low-molecular weight polyethylene glycol (PEG), polyvinyl pyrrolidone (PVP), polyvinyl alcohol (PVA), polysaccharides, and polysaccharide derivatives, and in the case in which the electrically-conductive nanowires are metal nanowires with the surface plasmon, an intensity of the second white light may be 300 to 1000 W/cm$^2$. The pulse width and the pulse interval of the second white light, and the number of irradiated pulse may be suitably adjusted in a range in which damages of the substrate may be prevented, and decomposition and removal of the organic binder may be promoted. As a non-restrictive example, the pulse width of the second white light may be 1 msec to 10 msec, the pulse interval (pulse gap) thereof may be 1.5 to 3 times the pulse width, and the number of irradiated pulse may be 2 to 30.

In the case in which the electrically-conductive nanowires are metal nanowires with the surface plasmon, the intensity of the pulse-type first white light of the second light may be 2000 to 3000 W/cm$^2$, and the single pulse of the pulse-type first white light may be irradiated with a pulse width of 5 msec to 15 msec.

In the case in which the organic binder is the above-mentioned natural or synthetic polymer having a low molecular weight, preferably, in the case in which the organic binder is one or two or more selected from the low-molecular weight polyethylene glycol (PEG), polyvinyl pyrrolidone (PVP), polyvinyl alcohol (PVA), polysaccharides, and polysaccharide derivatives, the second UV light of the second light may be irradiated at an intensity of 0.1 to 5 mW/cm$^2$ for 1 to 100 seconds, specifically, 10 to 60 seconds, and more specifically, 20 to 60 seconds, independently of the first UV light.

The present invention includes a transparent electrically-conductive film produced by the above-mentioned production method.

A transparent electrically-conductive film according to the present invention includes an electrically-conductive nanowire network in which electrically-conductive nanowires are melted to thereby be integrally bound to each other in contact regions between the electrically-conductive nanowires, and includes a transparent electrically-conductive film produced by the above-mentioned production method of which sheet resistance uniformity defined by the following Correlation Equation 6 is 90% or more, based on a large-area electrically-conductive nanowire network having an area of at least 20 mm×20 mm.

Sheet resistance uniformity (%)=[1−(standard deviation of sheet resistance)/average sheet resistance)]×100     (Correlation Equation 6)

Here, the standard deviation of sheet resistance and the average sheet resistance may be obtained by equally dividing a corresponding area into 9 regions and then randomly measuring sheet resistance in each of the divided region at least 10 times or more, based on the large-area electrically-conductive nanowire network having an area of at least 20 mm×20 mm.

At the time of performing bending test (two-point bending test) on the transparent electrically-conductive film according an exemplary embodiment to the present invention 1000 times at a radius of curvature of 1 cm, a sheet resistance increase rate defined by the following Correlation Equation 7 is 1.4 or less, such that the transparent electrically-conductive film may stably maintain electrical conductivity even in the case of repetitive deformation while having physical flexibility.

Sheet resistance increase rate=sheet resistance after bending test/sheet resistance before bending test     (Correlation Equation 7)

Further, a transparent electrically-conductive film according to the exemplary embodiment of the present invention may have a low sheet resistance of 70 to 100 ohm/sq and excellent light transmittance of 90% or more while having extremely uniform electrical properties.

Example 1

As electrically-conductive nanowires, silver nanowires (average diameter: 20 nm, average length: 25 μm) were used. As an ultraviolet-visible spectrum result, an absorption peak of the silver nanowires was 355.2 nm. As a binder, hydroxypropyl methyl cellulose (HPMC) having a weight average molecular weight of 86,000 was used, and as a solvent, deionized water was used. The silver nanowires and hydroxypropyl methyl cellulose were injected to the solvent and mixed with each other so that a dispersion contained 0.15 wt % of the silver nanowires and 0.15 wt % of hydroxypropyl methyl cellulose. As a substrate, a polyethylene terephthalate (PET) substrate was used, and the prepared dispersion was coated onto the substrate using a spin coating method. Thereafter, a near infrared (IR) light was irradiated to a coating film at an intensity of 350 W for 10 seconds using a near IR lamp (ADphos L40), thereby drying the coating film.

An ultraviolet (UV) light (first UV light) was irradiated at an intensity of 0.31 mW/cm$^2$, 0.69 mW/cm$^2$, or 2.78 mW/cm$^2$ for 60 seconds using a UV lamp (LUMATEC SUV-DC, UV-C). Thereafter, a pulse-type white light (first white light) with a pulse width of 10 msec was irradiated once(one pulse) at an intensity of 2600 W/cm$^2$ using a xenon lamp (first light, wavelength: 350 to 950 nm), thereby producing a transparent electrically-conductive film. In this case, it was confirmed that in the case of irradiating the UV light on a film made of pure HPMC and having a thickness of 500 nm at an intensity of 2.78 mW/cm$^2$ for 1 minute, a weight was not substantially decreased.

Example 2

After a coating film was prepared by the same method as in Example 1, a UV light (first UV light) was irradiated onto a dried coating film at an intensity of 2.78 mW/cm$^2$ for 10 seconds using a UV lamp and a xenon lamp, and simultaneously with irradiation of the UV light, a pulse-type white light (second white light) with a pulse width of 5 msec and a pulse gap of 10 msec was irradiated 15 times at an intensity of 666 W/cm$^2$. Then, a UV light (second UV light) was irradiated at an intensity of 2.78 mW/cm$^2$ for 50 seconds, and a pulse-type white light (first white light) with a pulse width of 10 msec was irradiated once at an intensity of 2600 W/cm$^2$ directly before the irradiation of the UV light (second UV light) was stopped, thereby producing a transparent electrically-conductive film.

Example 3

After a coating film was prepared by the same method as in Example 2, a UV light was continuously irradiated onto a dried coating film at an intensity of 2.78 mW/cm$^2$ for 60 seconds, simultaneously with irradiation of the UV light, a pulse-type white light (second white light) with a pulse width of 5 msec and a pulse gap of 10 msec was irradiated 15 times at an intensity of 666 W/cm$^2$. Thereafter, a pulse-type white light (first white light) with a pulse width of 10 msec was irradiated once at an intensity of 2600 W/cm$^2$ directly before the irradiation of the UV light was stopped, thereby producing a transparent electrically-conductive film.

In the Examples, an area of the transparent electrically-conductive film was 20 mm×20 mm, and after equally dividing the corresponding area into 9 regions, sheet resistance was randomly measured 10 times in each of the divided regions using a 4-point probe, and an average sheet resistance and a deviation of the sheet resistance were obtained based on measurement results in all of the divided regions.

FIG. 1 is a graph illustrating an average sheet resistance and a deviation of sheet resistance in the cases of a dried coating film (HPMC: 0 wt %) obtained by coating and drying a silver nanowire dispersion equally in Example 1 except for coating and drying a reference dispersion in which silver nanowires were dispersed without a binder, a dried coating film obtained by coating and drying a dispersion containing 0.07 wt % of hydroxypropyl methyl cellulose (HPMC), a dried coating film obtained by coating and drying a dispersion containing 0.15 wt % of HPMC equally in Example 1, and a dried coating film obtained by coating and drying a dispersion containing 0.3 wt % of HPMC.

As illustrated in FIG. 1, it may be appreciated that in the dispersion which did not contain an organic binder, sheet resistance was extremely high, and the deviation of the sheet resistance also was large, such that sheet resistance uniformity was significantly decreased.

FIG. 2 is a graph illustrating results obtained by measuring an average sheet resistance after irradiating a first light (UV irradiation of FIG. 2) and an average sheet resistance after irradiating a second light (IPL irradiation of FIG. 2), based on an average sheet resistance (100%) (No irradiation of FIG. 2) after irradiating the near infrared lamp in Example 1.

As illustrated in FIG. 2, it may be confirmed that even in the case of coating the silver nanowire dispersion containing the organic binder, the organic binder was removed in contact regions and sheet resistance was decreased by first light irradiation, and light welding between the silver nanowires was stably generated and the sheet resistance was further decreased by second light irradiation.

Sheet resistance uniformity of the transparent electrically-conductive film produced in Example 1 was 98.2% (first UV light irradiation, intensity: 0.31 mW/cm$^2$), 98.3% (first UV light irradiation, intensity: 0.69 mW/cm$^2$), or 98.5% (first UV light irradiation, intensity: 2.78 mW/cm$^2$), and the average sheet resistance thereof was 88.2 ohm/sq (first UV light irradiation, intensity: 0.31 mW/cm$^2$), 87.3 ohm/sq (first UV light irradiation, intensity: 0.69 mW/cm$^2$), or 84.6 ohm/sq (first UV light irradiation, intensity: 2.78 mW/cm$^2$). Therefore, it was confirmed that even in a large area of 20 mm×20 mm, a transparent electrically-conductive film having significantly uniform and low sheet resistance was produced.

FIG. 3 is a graph illustrating results obtained by measuring an average sheet resistance after irradiating a first light (UV-IPL(multi) of FIG. 3) and an average sheet resistance after irradiating a second light (UV-IPL (single) of FIG. 3) based on an average sheet resistance (100%) (No irradiation of FIG. 3) after irradiating the near infrared lamp in the transparent electrically-conductive film produced in Example 2. As known through the average sheet resistance of the film obtained after first light irradiation of FIG. 3, it may be appreciated that in the case of irradiating the pulse-type white light together with the UV light, the organic binder existing in contact regions between the silver nanowires was removed within a significantly short time, the sheet resistance was low, and at the time of irradiating the second light, more stable fusion was generated in the contact regions between the silver nanowires and the sheet resistance was further decreased. In addition, it was confirmed that the transparent electrically-conductive film produced in Example 2 had more excellent sheet resistance characteristics than those of the transparent electrically-conductive film produced in Example 1, and has sheet resistance uniformity equivalent to that of the transparent electrically-conductive film produced in Example 1.

It was confirmed through a scanning electron microscope that in Examples 1 and 2, the substrate was not damaged and the silver nanowires were not bound to each other at the time of irradiating the first light, and it was confirmed that at the time of irradiating the second light, a silver nanowire network in which the silver nanowires were bound to each other to thereby be physically integrated with each other was formed. Further, it was confirmed using a surface analysis method including X-ray photoelectron spectroscopy (XPS) that the organic binder remained on the substrate after the first light irradiation was performed.

In order to test interfacial characteristics and electrical conductivity degradation of the produced transparent electrically-conductive films, a bending test was performed. In detail, as the bending test, a two-point bending test was performed 1000 times at a bending radius of 10 mm. FIG. 4 is a graph illustrating a bending test result (shown by a square in FIG. 4) of a film obtained only by performing the drying and irradiation of the first light in Example 2 and a bending test result (shown by a circle in FIG. 4) of the transparent electrically-conductive film produced through Example 2. As illustrated in FIG. 4, it may be appreciated that even though the bending test was performed 1000 times at a radius of curvature of 10 mm, a sheet resistance increase rate of the transparent electrically-conductive film was 1.4 or less, such that a low sheet resistance may be stably maintained in spite of repetitive physical deformation. However, it may be appreciated that in the case in which fusion between the silver nanowires by the second light irradiation was not generated, contacts between the silver nanowires were broken by repetitive bending, such that a sheet resistance was rapidly increased.

FIG. 5 is a graph illustrating light transmittance (represented by a dotted line in FIG. 5) of a film obtained only by performing the drying and irradiation of the first light in Example 2 and light transmittance (represented by a solid line in FIG. 5) of the transparent electrically-conductive film produced through Example 2. As illustrated in FIG. 5, it may be appreciated that the organic binder remaining after the first light irradiation was removed by the second light irradiation, and light transmittance was improved.

In the transparent electrically-conductive film produced in Example 3 in the same manner as in Example 2 except for continuously irradiating the UV light, electrical properties, bending test result, and light transmittance characteristics, which were equal or similar to those in Example 2, were exhibited.

It was confirmed that as Comparative Example in which a transparent electrically-conductive film was produced in the same manner as in Example 2 except that only the second white light was irradiated at the time of irradiating the first light and only the first white light was irradiated at the time of irradiating the second light, light sintering was not generated. Further, it was confirmed that even in the case of increasing the intensity of the second white light to 933 W/cm$^2$ to irradiate the second white light 15 times and then irradiating the first white light, light sintering was not generated as illustrated in a scanning electron microscope photograph of FIG. 6.

Hereinabove, although the present invention is described by specific matters, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described embodiments, and the following claims as well as all modified equally or equivalently to the claims are intended to fall within the scope and spirit of the invention.

The invention claimed is:

1. A production method for a transparent electrically-conductive film, the production method comprising:
   a) a coating step of coating an electrically-conductive nanowire dispersion containing electrically-conductive nanowires with a surface plasmon and a polymer organic binder onto a substrate;
   b) a first light irradiation step of irradiating a first light including a first ultraviolet (UV) light onto the electrically-conductive nanowires on the substrate, thereby partially or entirely decomposing and removing the polymer organic binder existing in contact regions between the electrically-conductive nanowires; and
   c) after step b), a second light irradiation step of irradiating a second light including a pulse-type first white light onto the electrically-conductive nanowires, thereby melting and binding the contact regions between the electrically-conductive nanowires, wherein the first UV light at the time of irradiating the first light has an intensity such that the polymer organic binder is not removed by the first UV light itself but is removed only when the optical activities of the electrically-conductive nanowires on which surface plasmon is generated are combined with the first UV light.

2. The production method of claim 1, wherein the polymer organic binder is a natural or synthetic polymer having a molecular weight of $5 \times 10^5$ or less.

3. The production method of claim 2, wherein the polymer organic binder is a polysaccharide, the polysaccharide being glycogen, amylose, amylopectin, callose, agar, algin, alginate, pectin, carrageenan, cellulose, chitin, chitosan, curdlan, dextran, fructane, collagen, gellan gum, gum Arabic, starch, xanthan, gum tragacanth, carayan, carabean, glucomannan, or a combination thereof; or a polysaccharide derivative, the polysaccharide derivative being a cellulose ester or cellulose ether.

4. The production method of claim 3, wherein the polymer organic binder is carboxy-C1-C3-alkyl cellulose, carboxy-C1-C3-alkyl hydroxy-C1-C3-alkyl cellulose, C1-C3-alkyl cellulose, C1-C3-alkyl hydroxy-C1-C3-alkyl cellulose, hydroxy-C1-C3-alkyl cellulose, mixed hydroxy-C1-C3-alkyl cellulose, or a cellulose ether corresponding to a mixture thereof.

5. The production method of claim 2, wherein the polymer organic binder is polyethylene glycol (PEG), polyvinyl pyrrolidone (PVP), polyvinyl alcohol (PVA), or a mixture thereof.

6. The production method of claim 1, further comprising, after step a) but at least before step b), a third light irradiation step of irradiating a third light including an infrared (IR) light to the electrically-conductive nanowires on the substrate.

7. The production method of claim 1, wherein the second light further includes a second UV light.

8. The production method of claim 7, wherein in the second light irradiation step, the first white light is irradiated simultaneously with or during the irradiation of the second UV light.

9. The production method of claim 7, wherein intensities of the first and second UV lights are each independently 0.1 to 5 mW/cm².

10. The production method of claim 9, wherein irradiation times of the first and second UV lights are each independently 1 to 100 seconds.

11. The production method of claim 1, wherein the first light further includes a pulse-type second white light.

12. The production method of claim 11, wherein the first and second white lights each include a light having a wavelength corresponding to an absorption peak of the electrically-conductive nanowires in ultraviolet-visible spectra of the electrically-conductive nanowires.

13. The production method of claim 11, wherein the second white light satisfies the following Correlation Equation 3, $$I_{IPL2}(\exp) < I_{IPL2}(0) \qquad \text{(Correlation Equation 3)}$$

(In Correlation Equation 3, $I_{IPL2}(\exp)$ is an intensity of the second white light at the time of irradiating the first light, and $I_{IPL2}(0)$ is a minimum intensity when fusion is generated in the contact regions between the electrically-conductive nanowires at the time of applying a single pulse of the second white light with a pulse width of 10 msec to a reference substrate formed by coating and drying a reference dispersion which is the same as the electrically-conductive nanowire dispersion except for not containing the polymer organic binder).

14. The production method of claim 13, wherein irradiation of the second white light is multi-pulse irradiation.

15. The production method of claim 11, wherein the first and second lights are each independently or continuously irradiated.

16. The production method of claim 11, wherein an intensity of the second white light is 300 to 1000 W/cm².

17. The production method of claim 11, wherein an intensity of the first white light is 2000 to 3000 W/cm².

18. The production method of claim 1, wherein the first white light satisfies the following Correlation Equation 4, $$I_{IPL1}(0) \leq I_{IPL1}(\exp) < I_{IPL1}(c) \qquad \text{(Correlation Equation 4)}$$

(In Correlation Equation 4, $I_{IPL1}(\exp)$ is an intensity of the first white light at the time of irradiating the second light, $I_{IPL1}(0)$ is a minimum intensity when fusion is generated in the contact regions between the electrically-conductive nanowires at the time of applying a single pulse of the first white light with a pulse width of 10 msec to a reference substrate formed by coating and drying a reference dispersion which is the same as the electrically-conductive nanowire dispersion except for not containing the polymer organic binder, and $I_{IPL1}(c)$ is a minimum intensity when one electrically-conductive nanowire is cut into two or more nanostructures by partial melting in a major axis direction of the electrically-conductive nanowire at the time of applying the single pulse of the first white light with the pulse width of 10 msec to the reference substrate).

19. The production method of claim 18, wherein a single pulse of the first white light is irradiated.

20. The production method of claim 1, wherein the electrically-conductive nanowire dispersion contains 0.1 to 5 wt % of the polymer organic binder.

21. The production method of claim 1, wherein the electrically-conductive nanowires are nanowires of one or two or more selected from gold, silver, copper, lithium, aluminum, and an alloy thereof.

22. The production method of claim 1, wherein an aspect ratio of the electrically-conductive nanowires is 50 to 20000.

23. The production method of claim 1, wherein the substrate is a rigid substrate or flexible substrate.

24. The production method of claim 23, wherein the substrate is a multilayer substrate in which two or more materials different from each other are stacked while forming layers.

\* \* \* \* \*